(12) United States Patent
Rasmussen

(10) Patent No.: US 10,499,161 B2
(45) Date of Patent: Dec. 3, 2019

(54) MICROPHONE AND METHOD OF MANUFACTURING A MICROPHONE

(71) Applicant: EPCOS AG, Munich (DE)

(72) Inventor: Kurt Rasmussen, Herlev (DK)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/318,752

(22) PCT Filed: Jun. 23, 2014

(86) PCT No.: PCT/EP2014/063148
§ 371 (c)(1),
(2) Date: Dec. 14, 2016

(87) PCT Pub. No.: WO2015/197105
PCT Pub. Date: Dec. 30, 2015

(65) Prior Publication Data
US 2017/0150276 A1    May 25, 2017

(51) Int. Cl.
*H04R 1/04* (2006.01)
*H04R 19/04* (2006.01)
*B81B 7/00* (2006.01)
*H04R 19/00* (2006.01)
*H04R 31/00* (2006.01)
*B81C 1/00* (2006.01)

(52) U.S. Cl.
CPC ........... *H04R 19/04* (2013.01); *B81B 7/0061* (2013.01); *B81C 1/00269* (2013.01); *H04R 19/005* (2013.01); *H04R 31/00* (2013.01); *B81B 2201/0257* (2013.01); *B81C 2203/0109* (2013.01); *H04R 2201/003* (2013.01)

(58) Field of Classification Search
CPC .................. H04R 1/2853; H04R 2201/003
See application file for complete search history.

(56) References Cited

U.S. PATENT DOCUMENTS

| | | | |
|---|---|---|---|
| 7,165,647 B2* | 1/2007 | Lee | H04R 19/04 181/158 |
| 8,254,619 B2* | 8/2012 | Yeh | H04R 19/005 381/355 |
| 8,385,569 B2* | 2/2013 | Hachinohe | B81B 7/0061 381/189 |

(Continued)

FOREIGN PATENT DOCUMENTS

| | | |
|---|---|---|
| DE | 102004011148 B3 | 11/2005 |
| EP | 2381698 A1 | 10/2011 |

(Continued)

*Primary Examiner* — Curtis A Kuntz
*Assistant Examiner* — Ryan Robinson
(74) *Attorney, Agent, or Firm* — Slater Matsil, LLP

(57) ABSTRACT

A microphone and a method for manufacturing a microphone are disclosed. In an embodiment the microphone includes a substrate, a transducer element defining a front volume and a lid arranged such that the transducer element is arranged between the substrate and the lid, wherein the lid comprises an opening which is arranged non-overlapping to the front volume of the transducer element. The microphone further includes an insert arranged between the lid and the transducer element, wherein the insert includes a path which connects the front volume of the transducer element to the opening of the lid.

10 Claims, 3 Drawing Sheets

(56) References Cited

U.S. PATENT DOCUMENTS

| | | | |
|---|---|---|---|
| 8,565,465 B2 | 10/2013 | Inoda et al. | |
| 8,750,550 B2* | 6/2014 | Lee | H04R 19/005 |
| | | | 381/351 |
| 8,811,645 B2* | 8/2014 | Inoda | H04R 3/005 |
| | | | 381/355 |
| 8,965,027 B2* | 2/2015 | Bolognia | H04R 1/04 |
| | | | 381/175 |
| 9,002,038 B2* | 4/2015 | Ochs | H04R 23/00 |
| | | | 381/174 |
| 9,326,057 B2* | 4/2016 | Lee | H04R 1/04 |
| 9,544,678 B2* | 1/2017 | Lorenz | H04R 1/2853 |
| 2010/0067732 A1 | 3/2010 | Hachinohe et al. | |
| 2010/0128914 A1* | 5/2010 | Khenkin | H04R 19/005 |
| | | | 381/361 |
| 2011/0180924 A1* | 7/2011 | Tian | B81B 7/0061 |
| | | | 257/704 |
| 2011/0274299 A1 | 11/2011 | Shaw et al. | |
| 2012/0008805 A1* | 1/2012 | Hachinohe | B81B 7/0064 |
| | | | 381/163 |
| 2012/0148083 A1 | 6/2012 | Knauss et al. | |
| 2013/0051598 A1 | 2/2013 | Reining | |
| 2013/0136291 A1* | 5/2013 | Lee | H04R 19/005 |
| | | | 381/355 |
| 2014/0064546 A1* | 3/2014 | Szczech | H04R 1/04 |
| | | | 381/361 |
| 2014/0233756 A1* | 8/2014 | Inoda | H04R 1/38 |
| | | | 381/91 |
| 2017/0094402 A1* | 3/2017 | Pahl | H04R 1/222 |

FOREIGN PATENT DOCUMENTS

| | | |
|---|---|---|
| JP | 2009212844 A | 9/2009 |
| JP | 2010034991 A | 2/2010 |
| JP | 2010193120 A | 9/2010 |
| WO | 2011145790 A1 | 11/2011 |
| WO | 2013164021 A1 | 11/2013 |

* cited by examiner

MICROPHONE AND METHOD OF MANUFACTURING A MICROPHONE

This patent application is a national phase filing under section 371 of PCT/EP2014/063148, filed Jun. 23, 2014, which is incorporated herein by reference in its entirety.

TECHNICAL FIELD

The present invention concerns a microphone and a method of manufacturing a microphone. In particular, the microphone may be a capacitor microphone. In particular, the microphone may be a MEMS (micro-electromechanical system) microphone.

BACKGROUND

Such a microphone comprises a transducer element which is arranged in a housing. In order to achieve sufficient recording quality in such a microphone, a large back volume is essential as a large back volume increases the sensitivity of the transducer element. Moreover, a large back volume improves the signal-to-noise ratio.

DE 10 2004 011 148 B3 discloses a microphone wherein a microphone chip is encapsulated by a lid and a sound sealing. However, in this microphone, a strong mechanical coupling between the lid and the microphone chip is unavoidable which influences the functionality of the microphone chip and which results in a temperature-dependent behaviour of the microphone.

A different encapsulation of a MEMS microphone is known from US 2011/0274299 A1. However, this encapsulation has the disadvantage that the microphone only comprises a small back volume which results in a deterioration of the signal-to-noise ratio.

SUMMARY OF THE INVENTION

Embodiments of the invention provide an improved microphone which overcomes at least one of the above-discussed disadvantages. Further embodiments of the invention provide a method for manufacturing such a microphone.

A microphone is provided which comprises a substrate, a transducer element defining a front volume, a lid arranged such that the transducer element is arranged between the substrate and the lid, wherein the lid comprises an opening which is arranged non-overlapping to the front volume of the transducer element, and an insert which is arranged between the lid and the transducer element, wherein the insert comprises a path which connects the front volume of the transducer element to the opening of the lid.

The opening of the lid being arranged non-overlapping to the front volume of the transducer element is to be understood such that, in a perspective perpendicular to the substrate, the opening of the lid and the front volume of the transducer element do not overlap. Accordingly, when the opening of the lid and the front volume of the transducer element are projected onto the substrate, they do not overlap.

In other words, the front volume of the transducer element and the opening of the lid are arranged at a lateral distance to each other wherein said lateral distance is greater than zero. The opening is arranged adjacent to the front volume of the transducer element. The opening and the front volume are free from superposition with respect to each other.

In some embodiments, the opening may overlap with parts of the transducer element which are free from the front volume. In other embodiments, the opening may not overlap with the transducer element at all. This may be in regard to a perspective seen perpendicular to the substrate.

This position of the opening in the lid provides many advantages. As the sound inlet is not arranged directly on top of the transducer element, it is less likely that the transducer element will be damaged during operation, e.g. by dust or other pollution entering through the opening. In particular, dust entering through the opening into the microphone is less likely to deposit on the membrane. Such a deposition of dust on the membrane could deteriorate the sensitivity of the microphone.

Moreover, this design provides more flexibility regarding the placement of the opening. For example, for different applications, it may be necessary to construct microphones wherein the opening of the lid, i.e. the sound port of the microphone, is arranged at different positions. In this case, the transducer element and the substrate do not have to be varied. Only the insert and the placement of the opening in the lid have to be adjusted to construct a microphone wherein the opening is placed at a different position. Thus, a design with a different placement of an opening can be realized with minimal effort. In particular, the present design allows to always place the transducer element at the same position on the substrate and only to modify the insert and the lid for different applications.

The lid may comprise or consist of a conductive material. In particular, the lid may comprise or may consist of metal. Alternatively, the lid may comprise or consist of a conductive plastic, e.g. a conductive polymer. Thereby, the lid protects the transducer element against electromagnetic interface (EMI).

The path may connect the front volume and the opening of the lid acoustically. Accordingly, the front volume of the transducer may be configured to acoustically communicate with a surrounding of the microphone via the path and the opening of the lid.

The cross section of the path may be chosen large enough such that the path does not form a large acoustic resistance which might otherwise influence a resonance frequency of the microphone. Accordingly, the path may be designed such that the path neither reduces the signal-to-noise ratio of the microphone nor deteriorates the frequency response of the microphone.

The transducer element may comprise a movable membrane and a fixed backplate which are configured to form a capacitor when a voltage is applied between the membrane and the back plate. Further, the transducer element may be configured to measure sound which is applied to the membrane and which changes the capacitance of the capacitor formed by the membrane and the back plate.

The front volume may be a volume surrounded by the transducer element wherein the front volume is acoustically connected to a surrounding of the microphone. The front volume may be defined as the volume bounded by inner side walls of the transducer element, the membrane and a first end of the path.

The microphone may be a top-port microphone. Accordingly, the opening in the lid may be arranged on the side of the microphone which faces away from the substrate. The microphone may be a MEMS microphone. The microphone may be a capacitor microphone.

The insert may have a lateral extension which is larger than the lateral extension of the transducer element. The lateral dimension is the extension in a plane parallel to the substrate. Accordingly, the insert may completely cover the transducer element, when seen in a direction perpendicular to the substrate. This large lateral extension of the insert is particular advantageous with respect to the insert absorbing a force applied to the lid.

The insert may seal a gap between the transducer element and the lid. Thus, the insert may provide an acoustic decoupling of the front volume and the back volume.

The substrate may be a carrier chip. The substrate may comprise a ceramic material.

The insert may have a lower module of elasticity than the lid. Accordingly, the insert may provide a mechanical decoupling of the transducer element and the lid. In particular, a mechanical stress applied to the lid may be attenuated by the insert such that the stress is not applied to the transducer element or at least not fully applied to the transducer element. More particular, the insert is constructed to attenuate a stress applied to the lid in a direction towards the substrate. For example, when the microphone is assembled into a housing of a device, e.g. a mobile communication device, the lid may be pressed against the housing such that a pressure is applied to the lid. The insert is configured to absorb this pressure such that less mechanical stress is applied to the transducer element. Thereby, the mechanical properties of the transducer element are less disturbed by mechanical stress applied to the lid.

Furthermore, temperature changes may also result in a deformation of the lid. The deformation may also be absorbed by the insert. Thus, the deformation of the lid does not directly influence the transducer element. Accordingly, the temperature dependency of the microphone is improved by the insert. As a deformation of the lid does not directly apply to the transducer element, the whole microphone is less sensitive to temperature changes and can accordingly be used in a larger temperature range.

The insert may be a pre-casted or injection-molded insert. A pre-casted or injection-molded insert is easy to manufacture and can be manufactured with a high precision such that it can be ensured is accurately formed.

The insert may comprise a silicone rubber or a polymer. In particular, the insert may comprise a conductive Silicone rubber like Momentive silopren LSR2345/03 or other more standard injection molding non-conductive silicones or silicone rubber. These materials provide a low module of elasticity. Thereby, the insert allows for a better protection of the transducer element when a force is applied to the lid and/or when the lid is deformed due to temperature changes.

The back volume of the transducer element may be enclosed by the transducer element, the lid, the insert and the substrate. Accordingly, the present microphone comprises a large back volume which is essential for a good signal-to-noise ratio. In particular, the whole volume enclosed by the lid and the substrate minus the volume of the transducer element and, in some embodiments, minus the volume of further components arranged inside the lid can be used as a back volume of the transducer element.

The back volume may be a reference volume which is acoustically separated from the front volume. The back volume may be characterized as a volume which is designed such that the pressure in the back volume is not changed when sound is applied to the microphone.

The insert may be fixed to the lid. In particular, the insert may be glued to the lid. Accordingly, the insert and the lid may form an assembly which can easily be replaced by a different assembly of a different insert and a different lid for constructing a microphone wherein the opening is placed at a different position. This may be necessary for some applications. Accordingly, the insert being fixed to the lid provides a large design freedom.

The path may have a first end which overlaps with the front volume of the transducer element, a second end which overlaps with the opening of the lid and a middle section connecting the first end and the second end of the path such that the first end and the second end are arranged at a distance to each other. Said distance may be a lateral distance. In other words, the first and the second opening may be spaced apart from each other in a plane parallel to the substrate. Accordingly, when seen in a perspective perpendicular to the substrate, the opening and the front volume are spaced apart from each other. The path may further be designed such that no side volumes occur which would influence the frequency response of the microphone.

In some embodiments, the opening of the lid is arranged non-overlapping to the transducer element. Accordingly, this design allows to construct microphones wherein the opening is arranged away from the transducer element. This further improves the protection of the transducer element against pollution. Moreover, this increases the design freedom, as already discussed above.

According to the second aspect of the present invention, a method of manufacturing a microphone is provided. The microphone manufactured by said method may be the above-described microphone. Thus, any structural and functional feature disclosed with respect to the microphone may also be present with respect to the method. Vice versa, any functional or structural feature disclosed with respect to the method may also be present with respect to the microphone.

The method comprises the steps of:
arranging a transducer element on a substrate, wherein the transducer element defines a front volume,
fixing an insert to a lid, wherein the lid comprises an opening, wherein the insert comprises a path, and wherein the insert is fixed to the lid such that the path is connected to the opening, and
fixing the lid with the insert fixed thereto to the substrate such that transducer element is arranged between the lid and the substrate, and such that the path connects the front volume of the transducer element to the opening.

Accordingly, the lid and the insert may form an assembly which is assembled to the substrate and the transducer element in the manufacturing process. This provides a large design freedom as a first assembly of a first lid and a first insert may easily be replaced by a second assembly of a second lid and a second insert without having to vary the transducer element or the substrate.

Moreover, the requirements regarding the precision of the positioning of the assembly formed by the lid and the insert onto the substrate are moderate. Therefore, this method provides large tolerances. Thus, a high yield can be maintained when manufacturing the microphones.

In particular, the lid with the insert fixed thereto may be fixed to the substrate such that the opening of the lid is arranged non-overlapping to the front volume of the transducer element.

In one embodiment, the insert is fixed to the lid by gluing.

BRIEF DESCRIPTION OF THE DRAWINGS

In the following, the present invention is described in further with respect to the drawings.

DETAILED DESCRIPTION OF ILLUSTRATIVE EMBODIMENTS

Figure 1:
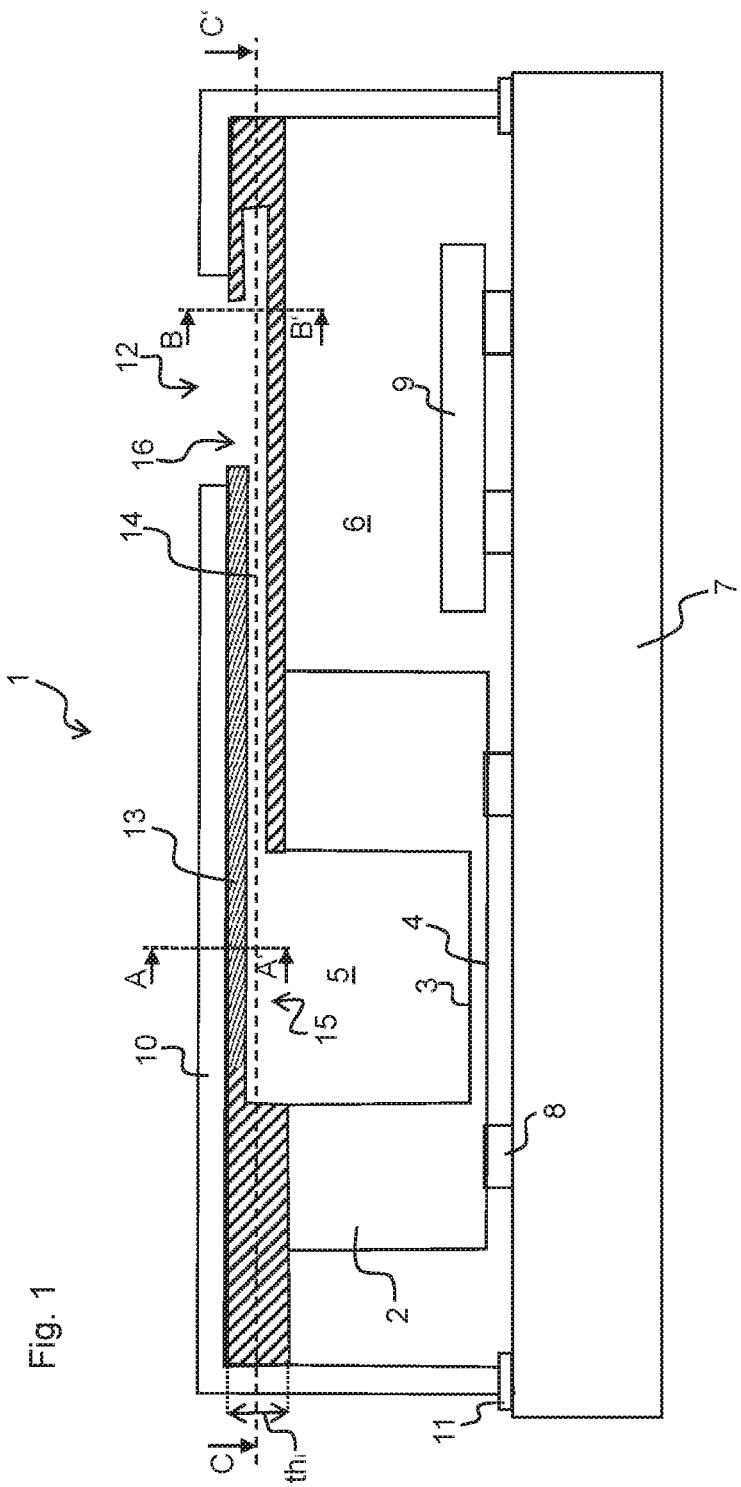
FIG. 1 shows a microphone.

FIG. 1 shows a microphone 1. The microphone 1 comprises a transducer element 2. The transducer element 2 comprises a movable membrane 3 and a fixed backplate 4. A voltage can be applied between the membrane 3 and the backplate 4 such that the membrane 3 and the backplate 4 form a capacitor. The capacitance of the capacitor is variable depending on a variation in the pressure applied to the microphone 1, e.g. variable in response to a sound being applied to the microphone 1.

The transducer element 2 defines a front volume 5. The front volume 5 is acoustically connected to a surrounding of the microphone 1. In particular, the microphone 1 is configured such that sound can travel to the front volume 5 of the transducer element 2. Moreover, the transducer element 2 defines a back volume 6. The back volume 6 of the transducer element 2 is a reference volume which is acoustically separated from the front volume 5. The transducer element 2 is configured to measure a difference in the sound pressure between the front volume 5 and the sound pressure in the back volume 6.

Further, the transducer element 2 is arranged on a substrate 7. In particular, the transducer element 2 is fixed to the substrate 7 via solder bumps 8.

Moreover, the microphone 1 comprises a further component 9. The further component 9 is an element which is configured to process the signals measured by the transducer element 2. In particular, the further component 9 is a chip with an ASIC (application-specific integrated circuit).

Further, the microphone 1 comprises a lid 10. The lid 10 comprises a conductive material or the lid 10 consists of a conductive material. The conductive material may be, for example, a metal or a conductive plastic, e.g. a conductive polymer. The lid 10 is fixed to the substrate 7. The lid 10 is fixed to the substrate 7 via a conductive adhesive 11. Alternatively, the lid 10 can be fixed to the substrate 7 via another connecting conductive material like a solder, for example lead free solder. The lid 10 comprises an opening 12. The opening 12 of the lid 10 forms the sound port of the microphone 1.

The opening 12 of the lid 10 is arranged non-overlapping to the transducer element 2. In particular, in a view perpendicular to the substrate 7, the opening 12 of the lid 10 does not overlap with the transducer element 2. Instead, the opening 12 of the lid 10 is arranged at a distance greater than zero away from the transducer element 2.

In an alternate embodiment which is not shown in the drawing, the opening 12 of the lid 10 may be arranged non-overlapping to the front volume 5 of the transducer element 2. In particular, in a view perpendicular to the substrate 7, the opening 12 of the lid 10 may not overlap with the front volume 5 of the transducer element 2. However, the opening 12 may overlap in said alternate embodiment with parts of the transducer element 2 which are free from the front volume 5.

Further, the microphone 1 comprises an insert 13. The insert 13 is arranged between the transducer element 2 and the lid 10. The insert 13 consists of a conductive silicone rubber. The insert 13 comprises a path 14. In particular, the front volume 5 of the transducer element 2 is connected to the opening 12 of the lid 10 via the path 14 of the insert 13. Thus, sound may enter through the opening 12 of the lid 10 and the path 14 into the front volume 5. Accordingly, the front volume 5 of the transducer element 2 is acoustically coupled to a surrounding of the microphone 1 via the path 14 and the opening 12 of the lid 10.

The insert 13 has a thickness $th_i$ in the range of 125 μm to 200 μm. However, in alternative designs, the insert may have a larger thickness $th_i$ in the range of 125 μm up to 500 μm. The thickness $th_i$ of the insert 13 is measured in the direction perpendicular to the substrate 7. The path 14 has a height of 30 μm to 60 μm. The height of the path 14 is also measured in the direction perpendicular to the substrate 7. Accordingly, in the areas wherein the path 14 is formed in the insert 13, the insert 13 has a thickness $th_i$ which is reduced by the height of the path 14.

Further, the back volume 6 of the transducer element 2 is enclosed by the transducer element 2, the substrate 7, the lid 10 and the insert 13. Thus, the microphone 1 comprises a large back volume 6. In particular, roughly the volume enclosed by the lid 10 minus the volume of the transducer element 2 can be used as a back volume 6. By increasing the back volume 6 of a microphone 1, the signal-to-noise ratio of the microphone 1 is also improved.

Figure 2:
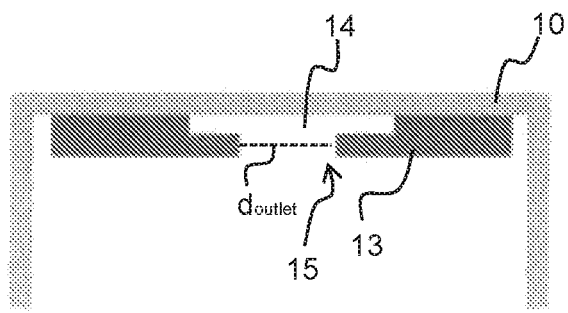
FIG. 2 shows a first cross-sectional view of a lid and an insert.

FIG. 2 shows a cross-section through the lid 10 and the insert 13 taken along the line AA' shown in FIG. 1. Here, a first end 15 of the path 14 overlaps with the front volume 5 of the transducer element 2. In particular, an outlet is formed at the first end 15 of the path 14 such that sound may exit from the path 14 at the first end 15 and enter into the front volume 5. The diameter $d_{outlet}$ of the outlet at the first end 15 of the path 14 is in the same size range as the diameter of front volume 5 of the transducer element 2. The diameter of the front volume 5 is defined as the maximal distance of two points of a boundary of the front volume 5 in a plane parallel to the substrate 7. In particular, the diameter $d_{outlet}$ of the outlet at the first end 15 is in the range between 0.5 times the diameter of the front volume 5 and twice the diameter of the front volume 5.

Figure 3:
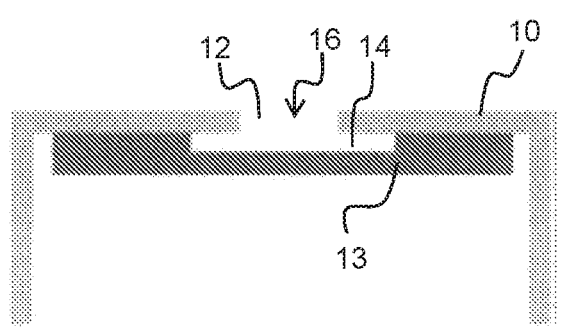
FIG. 3 shows a second cross-sectional view of a lid and an insert.

FIG. 3 shows a cross-section of the lid 10 and the insert 13 taken along the line BB' shown in FIG. 1. Here, a second end 16 of the path 14 of the insert 13 overlaps with the opening 12 of the lid 10. At the second end 16, an inlet is formed such that sound may enter the path 14 at the second end 16.

Figure 4:
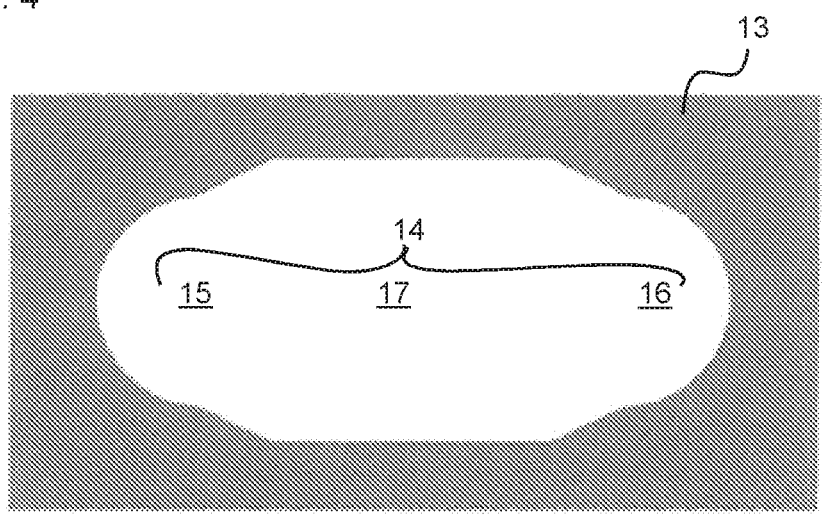
FIG. 4 shows an insert.

Further, FIG. 4 shows a cross-section through the insert 13 taken along the line CC' shown in FIG. 1. The first end 15 and the second end 16 of the path 14 are connected by a middle section 17. This design of the path 14 through the insert 13 ensures that no side volumes occur which would influence the frequency response of the microphone 1.

Figure 5:
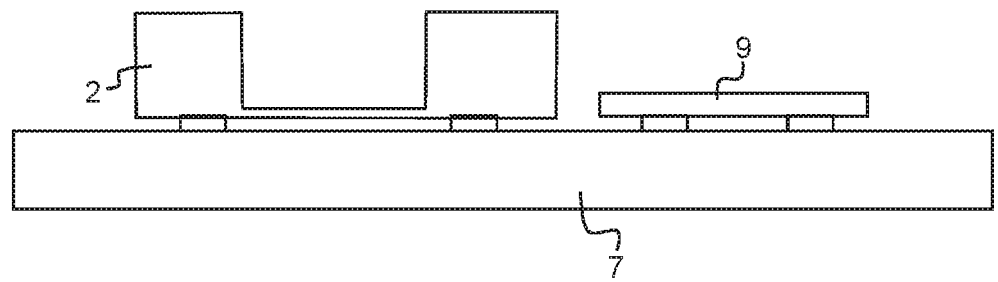
FIGS. 5 to 7 show a microphone during different stages of a manufacturing process.
Figure 6:
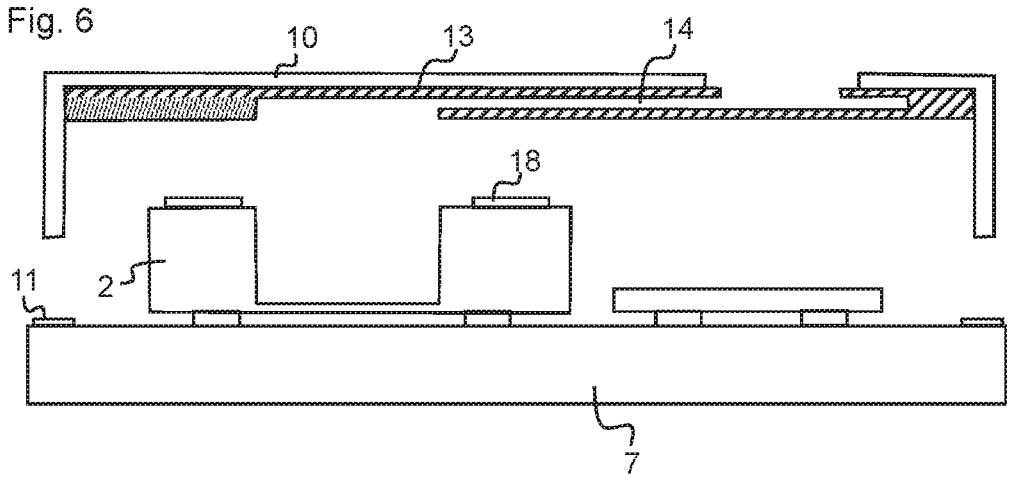
Figure 7:
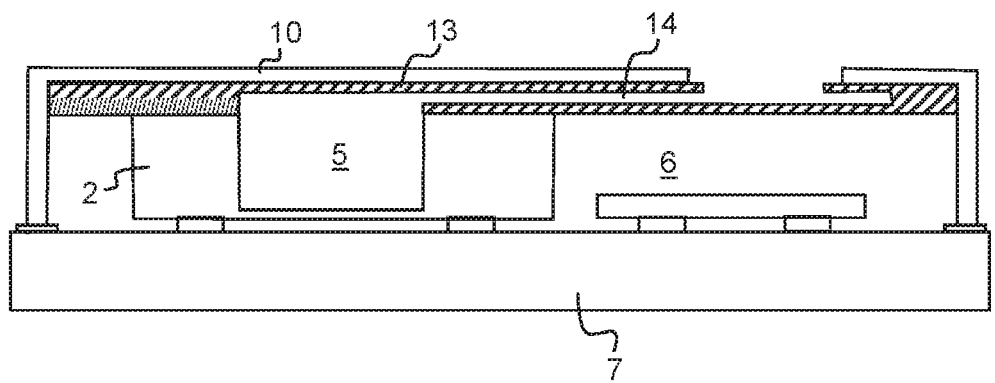

FIGS. 5 to 7 show different stages of the manufacturing process of the microphone 1.

FIG. 5 shows the microphone 1 at a manufacturing stage, wherein the transducer element 2 and the further component 9 have been attached to the substrate 7. In particular, the transducer element 2 and the further component 9 are flip-chip bonded to the substrate 7.

The further component 9 is an optional element. Alternatively to the further component 9 being arranged inside the lid 10, signal processing may be carried out by elements arranged outside of the microphone 1.

FIG. 6 shows the microphone 1 during a further manufacturing step. Before said further manufacturing step, the insert 13 is fixed to the lid 10 such that the path 14 of the insert 13 is connected to the opening 12 of the lid 10. In particular, a glue is applied between the insert 13 and the lid 10 and the insert 13 is glued to the lid 10. Accordingly, the lid 10 and the insert 13 form an assembly which is fixed to the rest of the microphone in the further manufacturing step as shown in FIG. 6.

Moreover, the adhesive 11 is applied onto the substrate 7. In particular, the adhesive 11 is applied onto the substrate 7 at the positions where the lid 10 will be connected to the substrate 7 in the further manufacturing step. Furthermore, another adhesive 18 is applied on the upper side of the transducer element 2 which faces away from the substrate 7. The insert 13 is mechanically connected to the transducer element 2 by the adhesive 18 in the further manufacturing step.

In the further manufacturing step, the assembly comprising the lid 10 and the insert 13 is attached to the substrate 7 and to the transducer element 2.

FIG. 7 shows the microphone after the manufacturing process is completed. In particular, a plurality of microphones 1 may be manufactured on a panel simultaneously. In this case, in a last step of the manufacturing process, the microphones 1 are singulated, e.g. by blade dicing.

I claim:

1. A microphone comprising:
   a substrate;
   a transducer element defining a front volume;
   a lid arranged such that the transducer element is arranged between the substrate and the lid, wherein the lid comprises an opening which is arranged non-overlapping to the front volume of the transducer element; and
   an insert arranged between the lid and the transducer element, wherein the insert comprises a path connecting the front volume of the transducer element to the opening of the lid, wherein the insert is a pre-cast insert or an injection molded insert, and wherein the opening of the lid is arranged so that the opening of the lid is non-overlapping with the transducer element;
   wherein the path consists of a first end overlapping with the front volume of the transducer element, a second end overlapping with the opening of the lid and a middle section connecting the first and the second end of the path such that the first end and the second end are arranged at a distance to each other, and
   wherein the middle section consists of an opening extending through the insert in a direction parallel to the substrate free of any turns.

2. The microphone according to claim 1, wherein the insert has a lower module of elasticity than the lid.

3. The microphone according to claim 1, wherein the insert comprises a silicone rubber.

4. The microphone according to claim 1, wherein the insert comprises a polymer.

5. The microphone according to claim 1, wherein a back volume of the transducer element is enclosed by the transducer element, the lid, the insert and the substrate.

6. The microphone according to claim 1, wherein the insert is fixed to the lid.

7. The microphone according to claim 1, wherein the insert covers the transducer element.

8. A method for manufacturing a microphone, the method comprising:
   arranging a transducer element on a substrate, wherein the transducer element defines a front volume;
   fixing an insert to a lid, wherein the lid comprises an opening, wherein the insert comprises a path, wherein the insert is fixed to the lid such that the path is connected to the opening, and wherein the insert is a pre-cast insert or an injection molded insert; and
   fixing the lid with the insert fixed thereto to the substrate such that the transducer element is arranged between the lid and the substrate and such that the path connects the front volume of the transducer element to the opening, and such that wherein the opening of the lid is non-overlapping with the transducer element;
   wherein the path consists of a first end overlapping with the front volume of the transducer element, a second end overlapping with the opening of the lid and a middle section connecting the first and the second end of the path such that the first end and the second end are arranged at a distance to each other; and
   wherein the middle section consists of an opening extending through the insert in a direction parallel to the substrate free of any turns.

9. The method according to claim 8, wherein the lid with the insert thereto is fixed to the substrate such that the opening of the lid is arranged non-overlapping to the front volume of the transducer element.

10. The method according to claim 8, wherein the insert is fixed to the lid by gluing.

* * * * *